United States Patent [19]

Tuerkes et al.

[11] Patent Number: 5,169,790
[45] Date of Patent: Dec. 8, 1992

[54] METHOD OF MAKING THYRISTOR HAVING LOW REFLECTION LIGHT-TRIGGERING STRUCTURE

[75] Inventors: Peter Tuerkes, Unterhaching; Reinhold Kuhnert, Munich, both of Fed. Rep. of Germany

[73] Assignee: Siemens Aktiengesellschaft, Munich, Fed. Rep. of Germany

[21] Appl. No.: 774,605

[22] Filed: Oct. 10, 1991

Related U.S. Application Data

[62] Division of Ser. No. 653,968, Feb. 12, 1991, Pat. No. 5,083,177.

[30] Foreign Application Priority Data

Mar. 12, 1990 [DE] Fed. Rep. of Germany ....... 4007817

[51] Int. Cl.[5] ............................................. H01L 49/00
[52] U.S. Cl. .................................... 437/6; 437/228
[58] Field of Search ............... 437/6, 17; 357/38, 39

[56] References Cited

U.S. PATENT DOCUMENTS

| | | |
|---|---|---|
| 3,991,460 | 11/1976 | Roberts . |
| 4,110,781 | 8/1978 | Konishi et al. ................. 357/39 |
| 4,147,564 | 4/1979 | Magee et al. ................... 437/17 |
| 4,216,487 | 8/1980 | Konishi et al. . |
| 4,370,797 | 2/1983 | van Gorkom et al. .......... 437/17 |
| 4,497,109 | 2/1985 | Huber et al. . |
| 5,080,728 | 1/1992 | Green et al. .................... 437/2 |

FOREIGN PATENT DOCUMENTS

| | | | |
|---|---|---|---|
| 53-68586 | 6/1978 | Japan | .......... 357/38 P |
| 57-085259 | 5/1982 | Japan | ............. 357/39 |

OTHER PUBLICATIONS

"Novel Gate Structure for High Voltage Light-Triggered Thyristor", Japanese Journal of Applied Physics, vol. 21, (1982), Supplement 21-1, pp. 91-96.

Primary Examiner—Olik Chaudhuri
Assistant Examiner—Loc Q. Trinh
Attorney, Agent, or Firm—Hill, Van Santen, Steadman & Simpson

[57] ABSTRACT

A thyristor having low-reflection light-triggering structure. In a light-triggerable thyristor, pyramidal depressions are formed in a simple manner by a preferred etching method, being formed in the region of the photon entry face in order to produce a low-reflection light-triggering structure. Incident light is absorbed in the pyramidal depressions largely independent of the wavelength of the incident light and nearly completely. The low-reflection light-triggering structure thereby produced can be formed with relatively little outlay. This is especially true when a defined overhead ignition voltage is simultaneously set by the pyramidal depressions.

1 Claim, 1 Drawing Sheet

METHOD OF MAKING THYRISTOR HAVING LOW REFLECTION LIGHT-TRIGGERING STRUCTURE

This is a division of application Ser. No. 653,968, filed Feb. 12, 1991, now U.S. Pat. No. 5,083,17.

BACKGROUND OF THE INVENTION

The present invention is directed to a thyristor having a low-reflection light-triggering structure and a method for manufacturing such a thyristor. The low-reflection light-triggering structure has a sequence of semiconductor layers of alternating conductivity types that comprise a p-emitter contacted by an electrode of an anode side, an n-base, a p-base and an n+-layer for the recesses of an n-emitter contacted on a cathode side and of an auxiliary emitter or floating gate region, whereby the auxiliary emitter or floating gate region has no electrical contacting but has a low-reflection photon entry face.

A thyristor of this type is disclosed in the publication, "Novel Gate Structure for High Voltage Light-Triggered Thyristor", from the Japanese Journal of Applied Physics, Vol. 21 (1982) Supplement 21-1, pages 91 through 96. For reducing the reflection, a λ/4-layer of silicon oxide is provided. However, this has the disadvantage that the degree of reflection is highly dependent on the wavelength λ and additional manufacturing process steps are required.

SUMMARY OF THE INVENTION

An object of the present invention is to specify a thyristor of the type initially cited that has a low-reflection light-triggering structure which can be manufactured with an optimally low number of additional process steps. This is inventively achieved by the low-reflection photon entry face being formed by pyramidal depressions at the photon entry face, whereby the reflectivity is largely independent of the wavelength of incident light. An overhead ignition-resistant thyristor having a defined overhead ignition voltage is also formed by the pyramidal depression when the pyramidal depressions are already present in the photon entry face before the doping of the p-base, so that the doping boundary surface between the p-base and the n-base follows the surface contour of the photon entry face.

An advantage of the present invention is that, due to the low-reflection light-triggering structure of the present invention, it can also be used for setting a defined overhead ignition voltage.

In a preferred method for manufacturing the light-triggering structure of the present invention, pyramidal depressions are formed by anisotropic etching of a {100}- wafer. The {100}-wafer is covered before the etching by an etching mask having quadratic mask opening aligned in {110}- direction relative to the crystal lattice.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
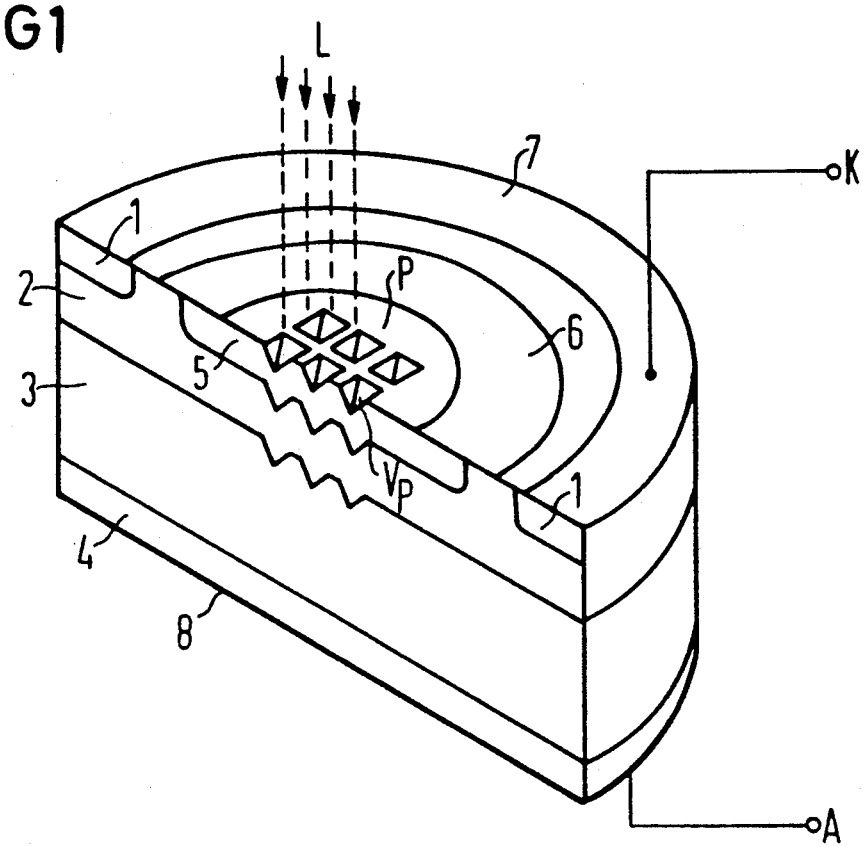
FIG. 1 is a perspective cross-sectional view of a thyristor of the present invention having a low-reflection light-triggering structure.

FIG. 1 shows an thyristor cf the present invention having a low-reflection light-triggering structure composed of four semiconductor layers of alternating conductivity type. A first layer is electrically connected to an anode electrode 8 and to an anode post A and represents the p-emitter layer 4 which is successively followed by an n-base layer 3, a p-base layer 2 and an n+-doped layer for the n-emitter 1 and auxiliary emitter 5. The auxiliary emitter 5 may be a floating gate region. This n+-doped layer also fills out the thyristor in a region immediately under the photon entry face P. the n-emitter 1 is electrically connected to the cathode electrode 7 and to the cathode post K. Furthermore, there is an electrically conductive connection 6 at the end face between the p-base 2 and the n+-doped region 5 directly under the photon entry face P in the region of the auxiliary emitter. The photon entry face P has pyramidal depressions $V_p$, fashioned according to the present invention, into which the light L is incident. The doping boundary surface between the layers 2 and 5 and the doping boundary surface between the layers 3 and 5 in the region of the photon entry face P follow the contour of the thyristor surface, which is provided with the depressions, when the doping of the layers 2 and 5 is not carried out until after the introduction of the depression. A permanently defined overhead ignition voltage is established on the basis of doping boundary surfaces fashioned according to the depressions.

When light L is incident on the photon entry face, some of the incident photons are reflected, but most penetrate into the interior of the thyristor where they produce electron-hole pairs due to the photo effect when their energy is greater than the band gap of the semiconductor material. Due to the applied voltage, a separation of the resulting holes and electrons occurs in the region of the p-base 2 and in the region of the n-base 3 such that the holes migrate into the p-base 2 and the electrons migrate into the n-base 3 as a base current. Due to amplification and feedback effects, the base current effects an avalanche-like rise in the anode current and a triggering of the thyristor.

In order to enable the triggering of the thyristor a minimum number of photons having adequate energy must proceed into the thyristor. Minimum reflection is therefore desirable in the region of the photon entry face P. According to the present invention, this is achieved by the pyramidal depressions $V_p$ in the region of the photon entry face P shown in FIG. 1.

The reduction in reflection arises in that the incident photons repeatedly encounter a boundary surface between semiconductor material and the surrounding medium. One part of the photons is thereby respectively absorbed and one part is reflected. Perpendicular incidence of unpolarized light can be assumed for a simple estimate of the photon absorption. The reflected part R is dependent on the refractive index n as follows:

$$R = ((n-1)/(n+1))^2.$$

When a k-fold reflection occurs, then only a part $R^k$ is reflected in the last reflection. The overall absorption after k reflections is;

$$A_p = 1 - R^k.$$

The refractive index for silicon is approximately n = 3.6; thus, $A_1 = 68\%$ of the incident photons are thus absorbed for one reflection; $A_2 = 90\%$ of the incident photons are absorbed for two reflections; and $A_3 = 97\%$ of the incident photons are absorbed for three reflections.

Figure 2:
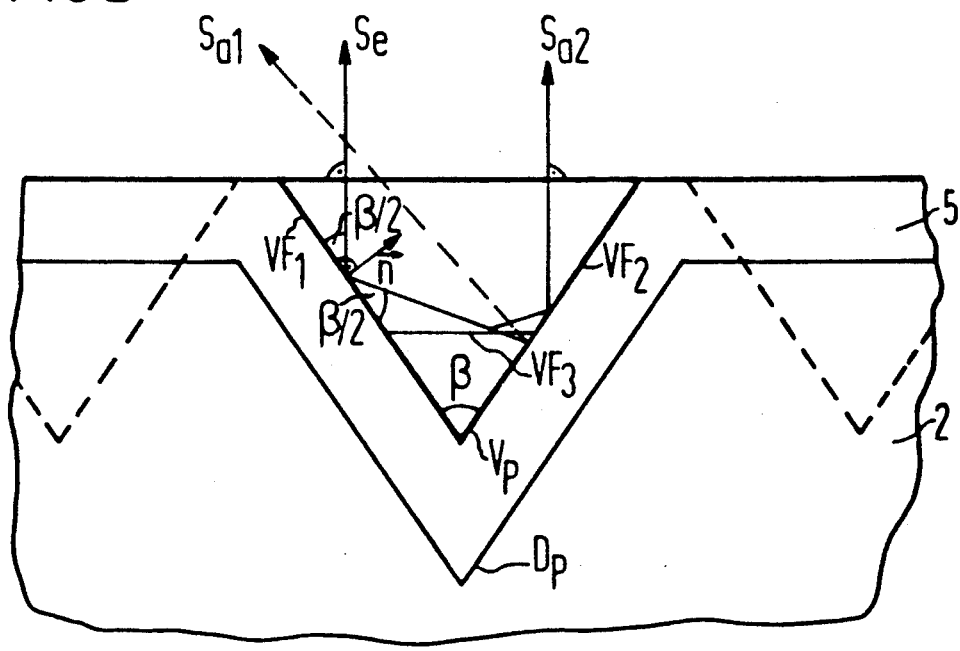
FIG. 2 is a section view through an enlarged part of the photon entry face of the thyristor shown in FIG. 1 with appertaining beam courses.

In order to illustrate this effect, an enlarged portion of the inventively fashioned photon entry face is shown in FIG. 2. An incident beam S* is reflected at two depression surfaces $VF_2$, $VF_2$ before it departs the depression $V_p$ as beam $S_{a1}$ or is reflected at the three depression surfaces $VF_1$, $VF_2$ and $VF_3$ before it emerges as beam S*2. A reflection at two surfaces occurs only when the plane formed by the incident beam S* and the normal vector n of the first reflective surface proceeds through the apex of the pyramid. Otherwise, the reflections occur over three of the four depression surfaces. The degree of absorption of the pyramidal depression $V_p$ will therefore amount to only somewhat less than 97%. The doping boundary surface $D_p$, under the pyramidal depression $V_p$ is also shown in FIG. 2 as a separating surface of the doping regions 2 and 5.

The pyramidal depressions in the photon entry face P of the thyristor can be simply produced by a preferred manufacturing method. In the method a {100}- Si wafer is used on which a mask having quadratic openings is aligned such that respectively one edge of the mask opening is parallel to the <110>- direction of the {100}- Si wafer an the etching is anisotropic. The apex angle $\beta$ in this case is approximately equal to 70°, as shown in FIG. 2, and is defined only by the crystallographic parameters. In this case, for example, the quadratic mask openings have an edge length of approximately 60 μm and are separated by narrow webs. The apex height of the pyramids then is approximately 40 μm, which represents a multiple of the thickness of the $n^+$-layer 5 and approximately half the p-layer 2.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A method for manufacturing a thyristor having a low-reflection light-triggering structure, the structure having a sequence of semiconductor layers of alternating conductivity types that has a p-emitter to which is electrically connected an anode electrode, an n-base, a p-base and an $n^+$-layer having recesses for an n-emitter to which is electrically connected a cathode electrode and for an auxiliary emitter, comprising the steps of: providing a 55 100}- wafer; covering the {100}- wafer by an etching mask having quadratic mask openings aligned in <110> direction relative to the crystal lattice; forming pyrmaidal depressions by anisotropic etching of the {100}- wafer; a low-reflection photon entry face being formed by the pyramidal depressions at the photon entry face, whereby the reflectivity is largely independent of the wavelength of light incident on the photon entry face; and forming an overhead ignition-resistant thyristor having defined overhead ignition voltage substantially by the pyramidal depressions before doping of the p-base, so that a doping boundary surface between the p-base and the n-base follows the surface contour of the photon entry face.

* * * * *